(12) United States Patent
Yun et al.

(10) Patent No.: US 11,532,798 B2
(45) Date of Patent: Dec. 20, 2022

(54) FLEXIBLE PAD FOR DISPLAY DEVICE LAMINATION PROCESS AND METHOD FOR MANUFACTURING A DISPLAY DEVICE USING THE SAME

(71) Applicant: Samsung Display Co., Ltd., Yongin-si (KR)

(72) Inventors: Kyu Sang Yun, Seoul (KR); Seon-Kyong Kim, Asan-si (KR); Hyoseung Kim, Sejong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 181 days.

(21) Appl. No.: 17/140,129

(22) Filed: Jan. 3, 2021

(65) Prior Publication Data

US 2021/0242413 A1 Aug. 5, 2021

(30) Foreign Application Priority Data

Jan. 30, 2020 (KR) ........................ 10-2020-0011234

(51) Int. Cl.
 *H01L 51/00* (2006.01)
 *H01L 51/56* (2006.01)
(52) U.S. Cl.
 CPC .......... *H01L 51/0097* (2013.01); *H01L 51/56* (2013.01); *H01L 2251/5338* (2013.01)

(58) Field of Classification Search
 CPC ............................................... H01L 2251/5338
 See application file for complete search history.

(56) References Cited

U.S. PATENT DOCUMENTS

| 9,827,753 | B2 | 11/2017 | Son et al. |
| 9,886,112 | B2 | 2/2018 | Namkung et al. |
| 10,207,483 | B2 | 2/2019 | Son et al. |

FOREIGN PATENT DOCUMENTS

| KR | 10-2016-0034468 | 3/2016 |
| KR | 10-2017-0023267 | 3/2017 |
| KR | 10-2018-0089609 | 8/2018 |
| KR | 10-1932124 | 12/2018 |

*Primary Examiner* — Vip Patel
(74) *Attorney, Agent, or Firm* — H.C. Park & Associates, PLC

(57) ABSTRACT

According to one aspect of the invention, a flexible pad for a display device lamination process includes: a generally straight area having an upper surface defining substantially the same height along a first direction and a generally convex shape along a second direction generally perpendicular to the first direction; a first inclined area having a first upper surface inclined along the first direction at a first inclination angle and being generally flat along the second direction; and a second inclined area disposed between the first inclined area and the generally straight area, wherein the second inclined area has a second upper surface inclined along the first direction at a second inclination angle smaller than the first inclination angle.

20 Claims, 11 Drawing Sheets

FLEXIBLE PAD FOR DISPLAY DEVICE LAMINATION PROCESS AND METHOD FOR MANUFACTURING A DISPLAY DEVICE USING THE SAME

CROSS-REFERENCE TO RELATED APPLICATION

This application claims priority from and the benefit of Korean Patent Application No. 10-2020-0011234, filed on Jan. 30, 2020, which is hereby incorporated by reference for all purposes as if fully set forth herein.

BACKGROUND

Field

Exemplary implementations of the invention relate generally to a flexible pad and, more specifically, to a flexible pad for a display device lamination process and a method for manufacturing a display device using the flexible pad.

Discussion of the Background

Generally, a display device may include a display panel and a protective window for protecting the display panel. The display panel may be attached to the protective window through a lamination process. A pressing member such as a silicon pad may be used for conformal contact of the display panel and the protective window.

The above information disclosed in this Background section is only for understanding of the background of the inventive concepts, and, therefore, it may contain information that does not constitute prior art.

SUMMARY

Flexible pads constructed and methods according to the principles and exemplary implementations of the invention provide a flexible pad capable of reducing concentration of stress applied to a pressed object.

Methods of manufacturing a display device according to the principles and exemplary implementations of the invention use the flexible pad. For example, the flexible pad may be used to attach a display panel with a protective window, thereby preventing damage to the display panel and trapped gas bubbles. Furthermore, the flexible pad may include an inclined area that may reduce or disperse a pressing load and/or a tensile force, applied to a physically weak area, such as a hole, of the display panel.

Additional features of the inventive concepts will be set forth in the description which follows, and in part will be apparent from the description, or may be learned by practice of the inventive concepts.

According to one aspect of the invention, a flexible pad for a display device lamination process includes: a generally straight area having an upper surface defining substantially the same height along a first direction and a generally convex shape along a second direction generally perpendicular to the first direction; a first inclined area having a first upper surface inclined along the first direction at a first inclination angle and being generally flat along the second direction; and a second inclined area disposed between the first inclined area and the generally straight area, wherein the second inclined area has a second upper surface inclined along the first direction at a second inclination angle smaller than the first inclination angle.

The first inclined area may have a first thickness, and the second inclined area may have a second thickness greater than the first thickness.

The flexible pad may include a silicone resin.

The second upper surface may have a generally round shape along the first direction.

The second inclined area may at least partially surround the first inclined area in a plan view.

The second upper surface of the second inclined area may be inclined along the second direction.

The first upper surface may be connected to a first side surface, and the upper surface of the generally straight area may be connected to a second side surface opposite to the first side surface.

The second upper surface of the second inclined area may be connected to a third side surface and a fourth side surface, which may connect the first side surface to the second side surface with the third and fourth surface being opposite to each other.

According to another aspect of the invention, a method for manufacturing a display device includes the steps of: disposing a protective window on a display panel including an opening or a cut portion; disposing a flexible pad under the display panel; and moving the flexible pad toward the protective window so that the display panel contacts the protective window, wherein the flexible pad includes a generally straight area, a first inclined area overlapping the opening or the cut portion of the display panel and a second inclined area disposed between the generally straight area and the first inclined area, an upper surface of the generally straight area having substantially the same thickness along a first direction and having a generally convex shape along a second direction substantially perpendicular to the first direction, an upper surface of the first inclined area inclined along the first direction and generally flat along the second direction, an upper surface of the second inclined area inclined along the first direction by an inclination angle smaller than an inclination angle of the upper surface of the first inclined area.

The display panel may include an organic light-emitting display panel.

The display panel may include a flexible base substrate including a polymeric material.

The opening or the cut portion of the display panel may form a hole.

The step of bending the display panel before the display panel may contact the protective window.

The step of bending the display panel may include moving clamps attached to both ends of the display panel so that a distance between the clamps may be reduced.

The flexible pad may include a silicone resin.

The upper surface of the second inclined area may have a generally round shape along the first direction.

The upper surface of the second inclined area may be inclined along the second direction.

The first upper surface of the first inclined area may be connected to a first side surface, and the upper surface of the generally straight area may be connected to a second side surface opposite to the first side surface, wherein the second upper surface of the second inclined area may be connected to a third side surface and a fourth side surface, which may couple the first side surface to the second side surface and are opposite to each other.

According to a further aspect of the invention, a flexible pad for a display panel lamination process includes: a generally straight area with an upper surface having substantially the same height along a first direction and a generally convex shape along a second direction substantially perpendicular to the first direction; a first inclined area with an upper surface being inclined along the first direction and generally flat along the second direction and connected to a first end of the upper surface of the generally straight area; and a second inclined area with an upper surface being inclined along the first direction and generally flat along the second direction and connected to a second end of the upper surface of the generally straight area to the first end.

The upper surface of the first inclined area may be connected to a first side surface, an upper surface of the second inclined area may be connected to a second side surface opposite to the first side surface, wherein the upper surface of the generally straight area may be connected to the first and second side surfaces so the generally straight area at least partially may surround the first and second inclined areas, respectively, in a plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
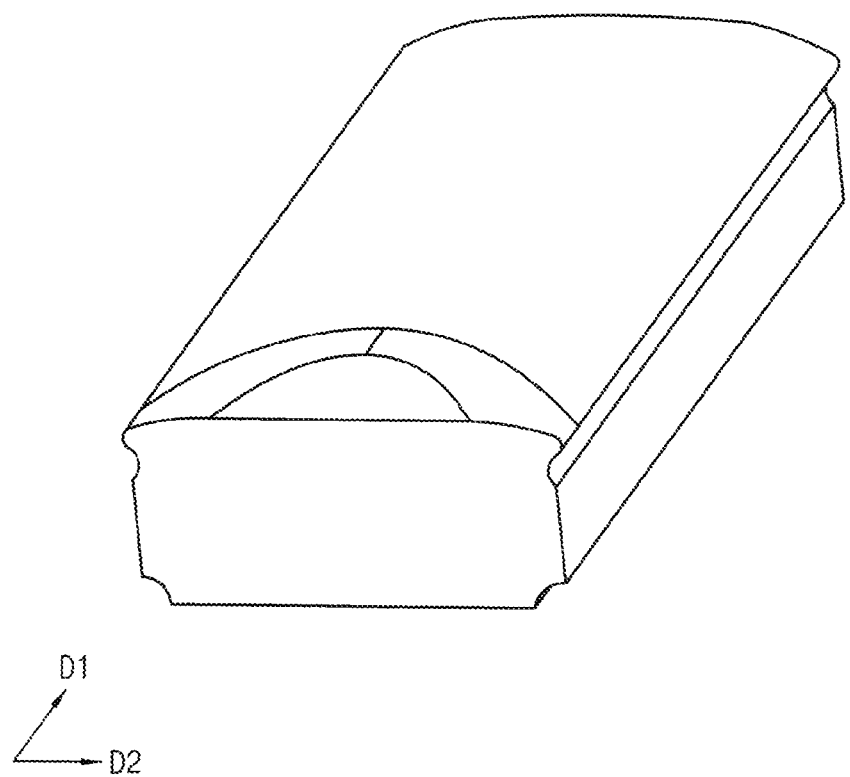
FIG. 1 is a perspective view of an exemplary embodiment of a flexible pad constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
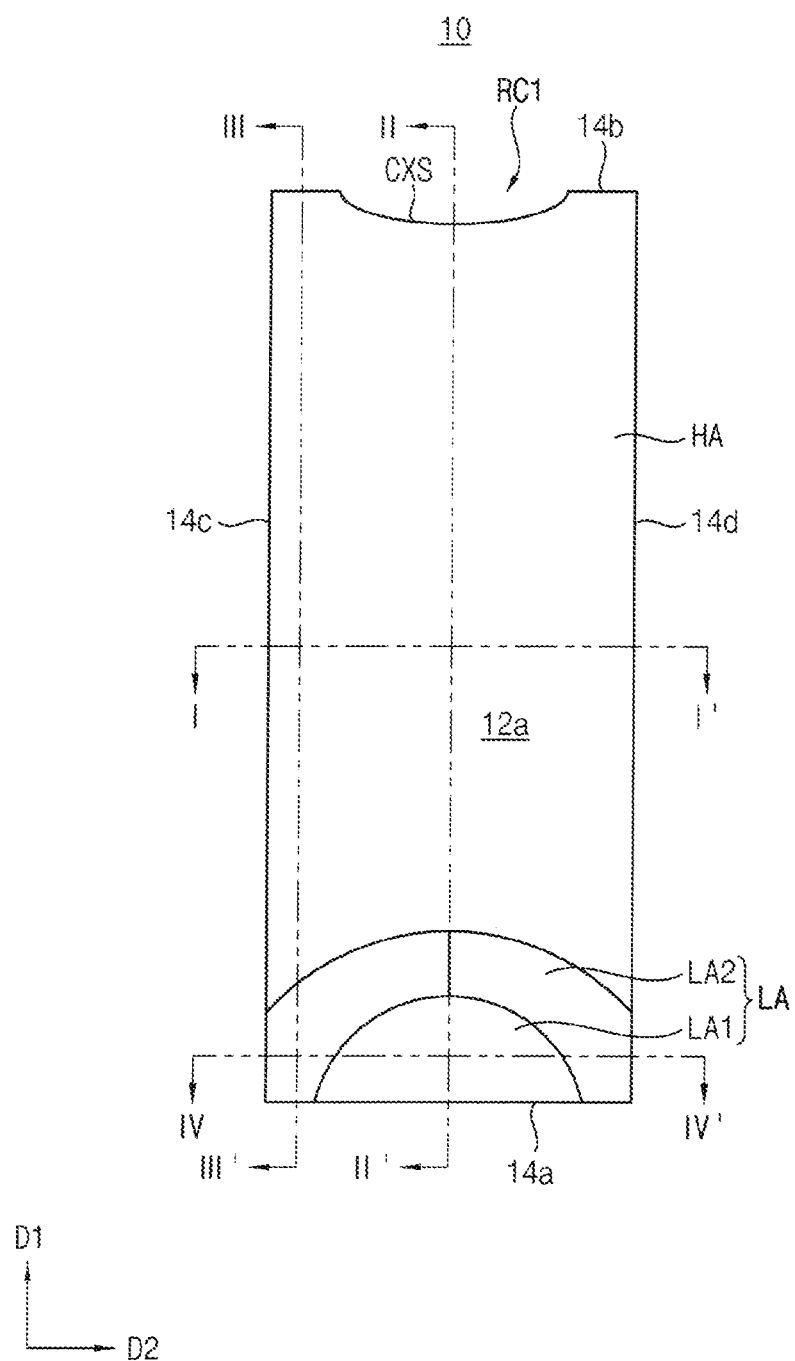
FIG. 2 is a plan view of the flexible pad of FIG. 1.
Figure 3:
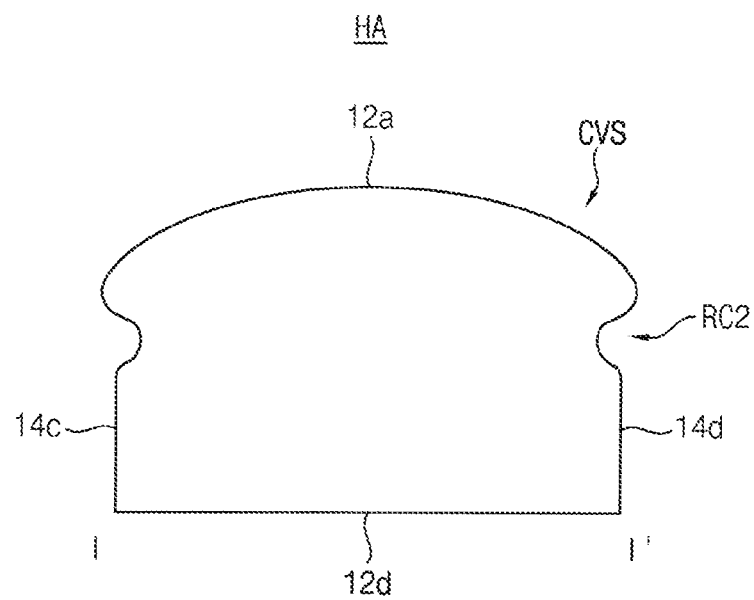
FIG. 3 is a cross-sectional view taken along the line I-I' of FIG. 2.
Figure 4:
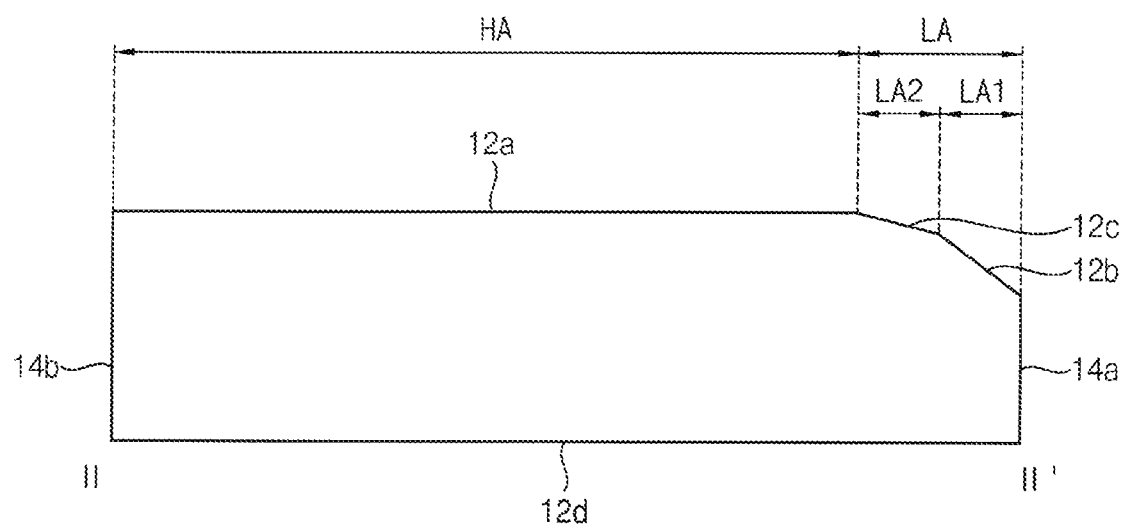
FIG. 4 is a cross-sectional view taken along the line II-IF of FIG. 2.
Figure 5:
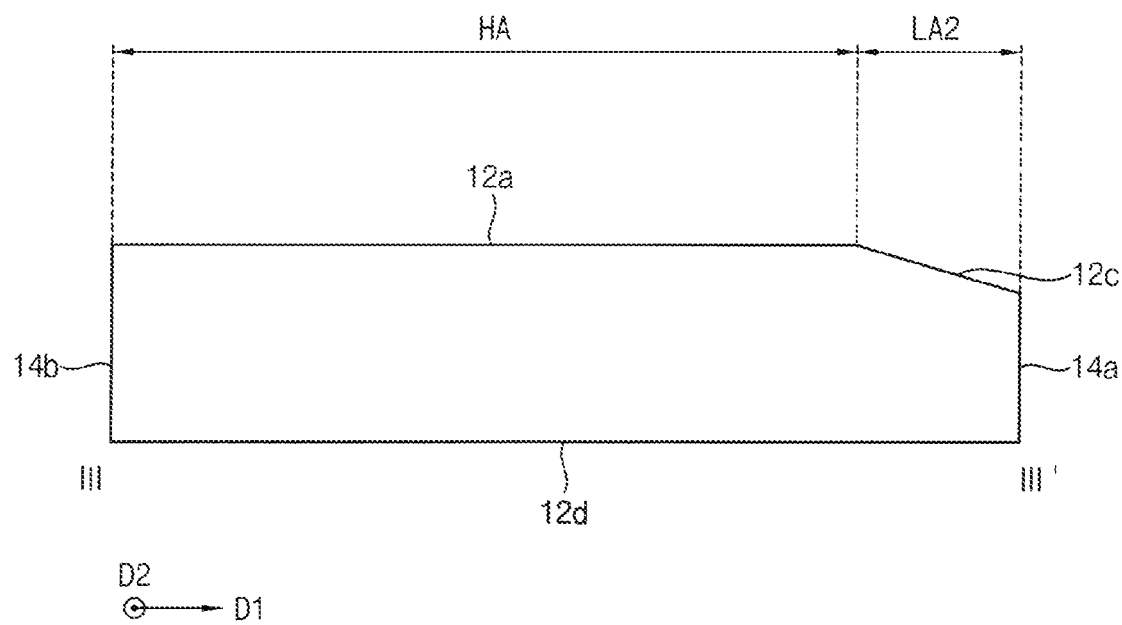
FIG. 5 is a cross-sectional view taken along the line of FIG. 2.
Figure 6:
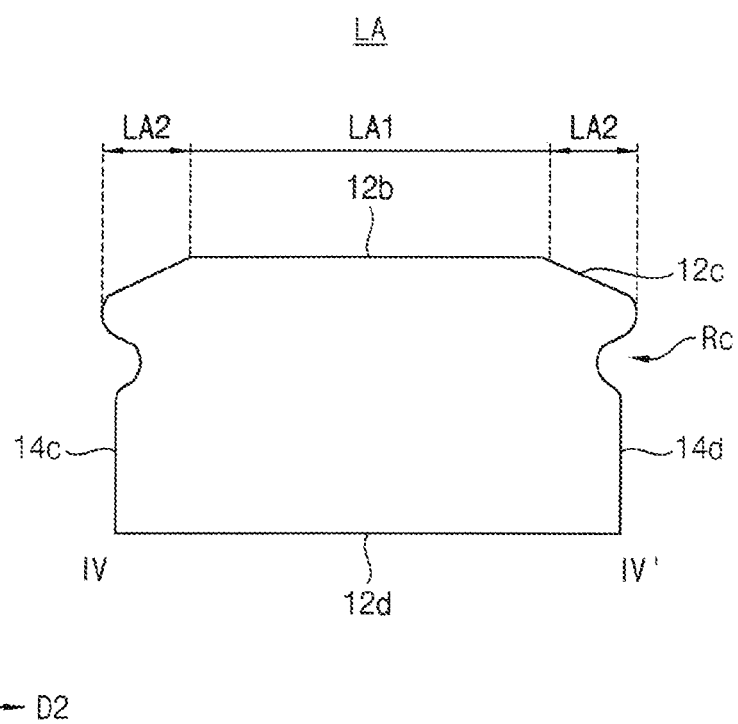
FIG. 6 is a cross-sectional view taken along the line IV-IV' of FIG. 2.

FIG. 1 is a perspective view of an exemplary embodiment of a flexible pad constructed according to principles of the invention. FIG. 2 is a plan view of the flexible pad of FIG. 1. FIG. 3 is a cross-sectional view taken along the line I-I' of FIG. 2. FIG. 4 is a cross-sectional view taken along the line II-IF of FIG. 2. FIG. 5 is a cross-sectional view taken along the line of FIG. 2. FIG. 6 is a cross-sectional view taken along the line IV-IV' of FIG. 2.

Referring to FIGS. 1 to 4, a flexible pad 10 includes a generally straight, area HA having upper 12a and bottom surfaces 12d, which may extend longitudinally in a horizontal direction along a first direction D1. Thus, area HA has substantially the same height (thickness) along the first direction D1. Pad 10 also includes an inclined area LA having an upper surface inclined downwardly toward the bottom surface along the first direction D1.

In an exemplary embodiment, the flexible pad 10 may be a silicone pad including silicone. For example, the silicone pad may include a cured silicone resin.

For example, the flexible pad 10 may have a substantially rectangular shape in a plan view. The length of the flexible pad 10 along the first direction D1 may be greater than the length along a second direction D2 perpendicular to the first direction D1. In an exemplary embodiment, the flexible pad 10 may include a first recess RC1 extending inwardly from a side surface 14b. For example, the first recess RC1 may receive a bonding portion extending from a display panel, when the display panel is disposed on the flexible pad 10. The bonding portion may be attached to a driving device.

Referring to FIG. 2, the inclined area LA may include a first inclined area LA1 and a second inclined area LA2, which are inclined at different inclination angles. The second inclined area LA2 may be disposed between the first inclined area LA1 and the generally straight area HA. The boundary between the second inclined area LA2 and the generally straight area HA may have a generally arcuate shape in a plan view. Furthermore, the boundary between the second inclined area LA2 and the first inclined area LA1 may have a generally arcuate shape in the plan view.

Referring to FIG. 3, the upper surface 12a of the generally straight area HA may have a generally convex shape CVS, in which a height of a center portion is greater than the height of a peripheral portion, in a cross-sectional view along a second direction D2 substantially perpendicular to the first direction D1. For example, the upper surface 12a of the generally straight area HA may have a generally arcuate shape or generally convex shape CXS along the second direction D2.

In the cross-sectional view along the second direction D2, the flexible pad 10 may include a second recess RC2 extending inwardly from a side surface. For example, the second recess RC2 may be formed at both side surfaces 14c and 14d of the flexible pad 10. The second recess RC2 may prevent deformation of the flexible pad 10 from being concentrated in a lower area.

Referring to FIG. 4, the inclined area LA has a height (thickness) smaller than the height (thickness) of the generally straight area HA in the cross-sectional view along the first direction D1.

An upper surface 12c of the second inclined area LA2 may be connected to the upper surface 12a of the generally straight area HA. An upper surface 12b of the first inclined area LA1 may be connected to the upper surface 12c of the second inclined area LA2 and the first side surface 14a of the flexible pad 10. The upper surface 12a of the generally straight area HA may be connected to a second side surface 14b opposite to the first side surface 14a.

The upper surfaces 12b and 12c of the first and second inclined areas LA1 and LA2 may be inclined along the first direction D1. For example, the upper surfaces 12b and 12c of the first and second inclined areas LA1 and LA2 may be inclined so that the heights thereof may be reduced in a direction extending away from generally straight area HA.

In an exemplary embodiment, the first inclined area LA1 may be adjacent to the first side surface 14a of the flexible pad 10, in a plan view. The second inclined area LA2 may partially surround the first inclined area LA2 in the plan view. For example, the first inclined area LA1 may be connected to the first side surface 14a. The second inclined area LA2 may be connected to the first side surface 14a, a third side surface 14c generally perpendicular to the first side surface 14a and a fourth side surface 14d generally perpendicular to the first side surface 14a and opposite to the third side surface 14c. Thus, the width of the second inclined area LA2 along the second direction D2 may be greater than the width of the first inclined area LA1, as shown in FIG. 2. In an exemplary embodiment, the inclination angle of the first inclined area LA1 may be greater than the inclination angle of the second inclined area LA2, as shown in FIG. 4. The height (thickness) of the first inclined area is less than the height (thickness) of the second inclined area FIG. 5 illustrates a cross-section of a peripheral area, where the first inclined area LA1 is not provided, along the first direction D1. Referring to FIG. 5, in a cross-section, the first inclined area LA1 is not present. Thus, the upper surface 12c of the second inclined area LA2 may be connected to the upper surface 12a of the generally straight area HA and the first side surface 14a.

Referring to FIG. 6, in a cross-section of the inclined area LA along the second direction D2, the upper surface 12b of the first inclined area LA1 may be generally flat to have substantially the same height, and the upper surface 12c of the second inclined area LA2 may be inclined. For example, in the cross-section of the inclined area LA along the second direction D2, the height of the first inclined area LA1 may be greater than the height of the second inclined area LA2. The upper surface 12b of the first inclined area LA1 may be connected to the upper surface 12c of the second inclined area LA2. The height of the upper surface 12c of the second inclined area LA2 may be reduced in a direction extending away from the first inclined area LA1.

In an exemplary embodiment, the upper surface 12a of the generally straight area HA may be substantially flat along the first direction D1 and may be generally convex along the second direction D2 to have a protruding center portion. The upper surface 12b of the first inclined area LA1 may be inclined along the first direction D1 and may be substantially flat along the second direction D2. The upper surface 12c of the second inclined area LA may be inclined along the first direction D1 and along the second direction D2.

Figure 7:
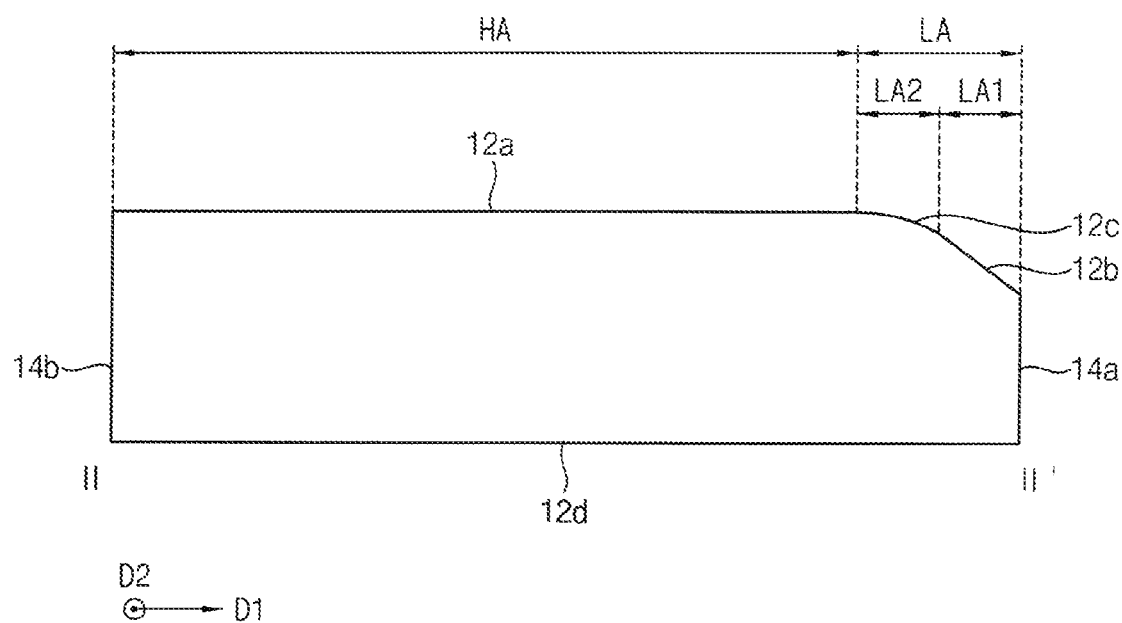
FIG. 7 is a cross-sectional view of another exemplary embodiment of a flexible pad constructed according to principles of the invention.

FIG. 7 is a cross-sectional view of another exemplary embodiment of a flexible pad constructed according to principles of the invention. FIG. 7 illustrates a generally straight area and an inclined area along the first direction as illustrated in FIG. 4.

Referring to FIG. 7, an inclined area LA may have a height smaller than the height of a generally straight area HA in a cross-section along the first direction D1. In an exemplary embodiment, the inclined area LA may include a first inclined area LA1 and a second inclined area LA2. The second inclined area LA2 may be disposed between the first inclined area LA1 and the generally straight area HA.

An upper surface 12c of the second inclined area LA2 may be connected to an upper surface 12a of the generally straight area HA. An upper surface 12b of the first inclined area LA1 may be connected to the upper surface 12c of the second inclined area LA2 and a first side surface 14a of a flexible pad 10. The upper surface 12a of the generally straight area HA may be connected to a second side surface 14b opposite to the first side surface 14a.

The upper surfaces 12b and 12c of the first and second inclined areas LA1 and LA2 may be inclined along the first direction D1. For example, the upper surfaces 12b and 12c of the first and second inclined areas LA1 and LA2 may be inclined so that heights thereof may be reduced in a direction extending away from generally straight area HA.

In an exemplary embodiment, the upper surface 12b of the first inclined area LA1 may be inclined along the first direction D1 and may extend substantially straightly. The upper surface 12c of the second inclined area LA2 may have a generally round shape such as a generally arcuate shape.

Figure 8:
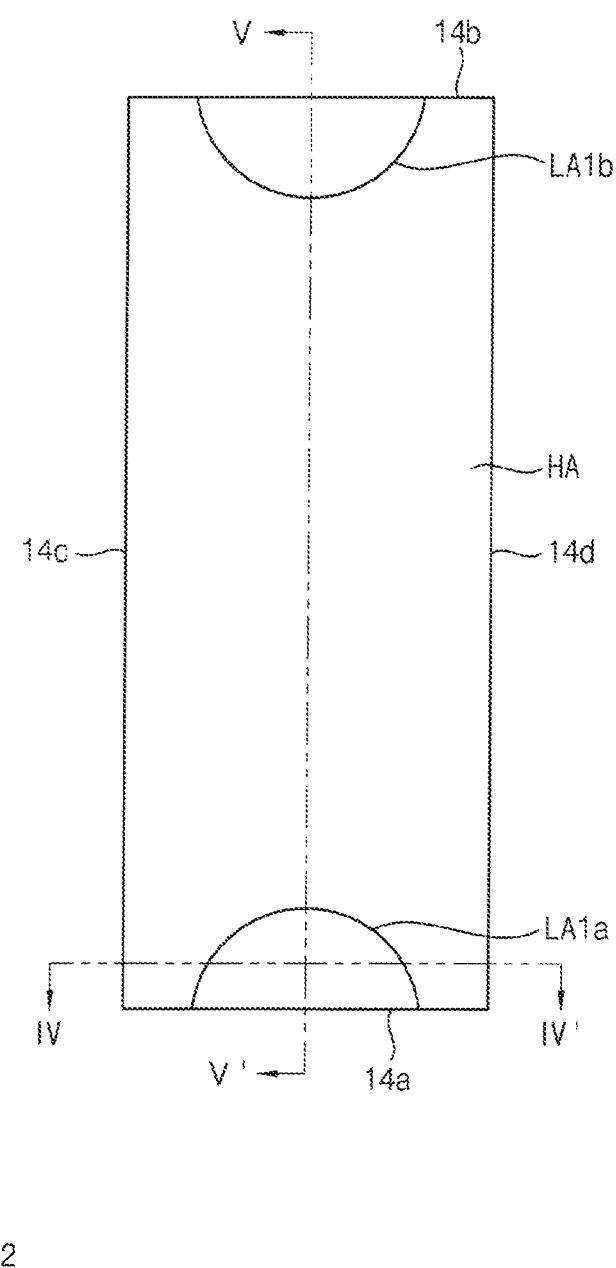
FIG. 8 is a plan view of another exemplary embodiment of a flexible pad constructed according to principles of the invention.
Figure 9:
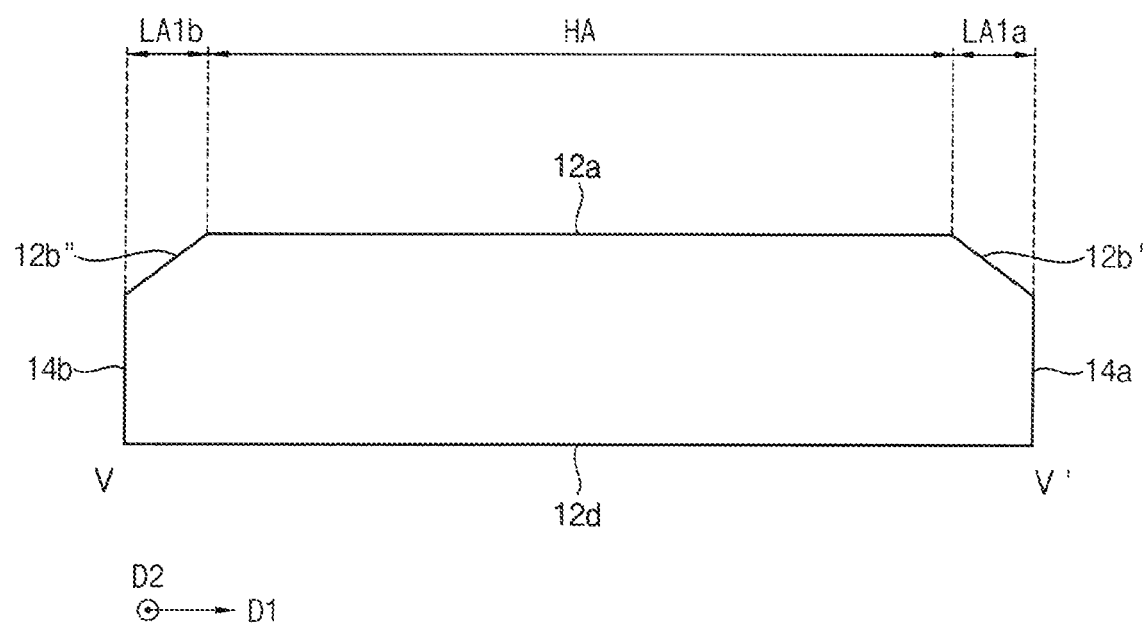
FIG. 9 is a cross-sectional view taken along the line V-V' of FIG. 8.

FIG. 8 is a plan view of another exemplary embodiment of a flexible pad constructed according to principles of the invention. FIG. 9 is a cross-sectional view taken along the line V-V' of FIG. 8. Referring to FIGS. 8 and 9, a flexible pad 10 may include a first inclined area LA1a, a second inclined area LA1b and a generally straight area HA disposed between the first and second inclined areas LA1a and LA1b. An upper surface 12b' of the first inclined area LA1a and an upper surface 12b" of the second inclined area LA1b may be connected to an upper surface 12a of the generally straight area HA. For example, the upper surface 12b' of the first inclined area LA1a may be connected to a first end of the upper surface 12a of the generally straight area HA, and the upper surface 12b" of the second inclined area LA1b may be connected to a second end of the upper surface 12a of the generally straight area HA, which is opposite to the first end.

The upper surfaces 12b' and 12b" of the first and second inclined areas LA1a and LA1b may be inclined so that heights (thicknesses) thereof may be reduced in a direction extending away from generally straight area HA.

The upper surface 12b' of the first inclined area LA1a may be connected to a first side surface 14a, and the upper surface 12b" of the second inclined area LA1b may be connected to a second side surface 14b opposite to the first side surface 14a. The upper surface 12a of the generally straight area HA may be connected to the first and second side surfaces 14a and 14b so that the generally straight area HA may partially surround the first inclined area LA1a and the second inclined area LA1b, respectively, in a plan view.

The inclination angle of the first inclined area LA1a may be substantially same as the inclination angle of the second inclined area LA1b. However, the exemplary embodiments are not limited thereto. For example, the inclination angle of the first inclined area LA1a may be different from the inclination angle of the second inclined area LA1b. Furthermore, at least one of the upper surfaces 12b' and 12b" of the first and second inclined areas LA1a and LA1b may have a generally round shape such as a generally arcuate shape.

Flexible pads according to some exemplary embodiments may be used for a pressing member in a lamination process. For example, the flexible pads may be used in a process of combining a display panel with a protective window for manufacturing a display device. The flexible pads may reduce load applied to a physically weak area such as a hole and may reduce stress concentration. Thus, damage of the display panel may be prevented or reduced.

Figure 10:
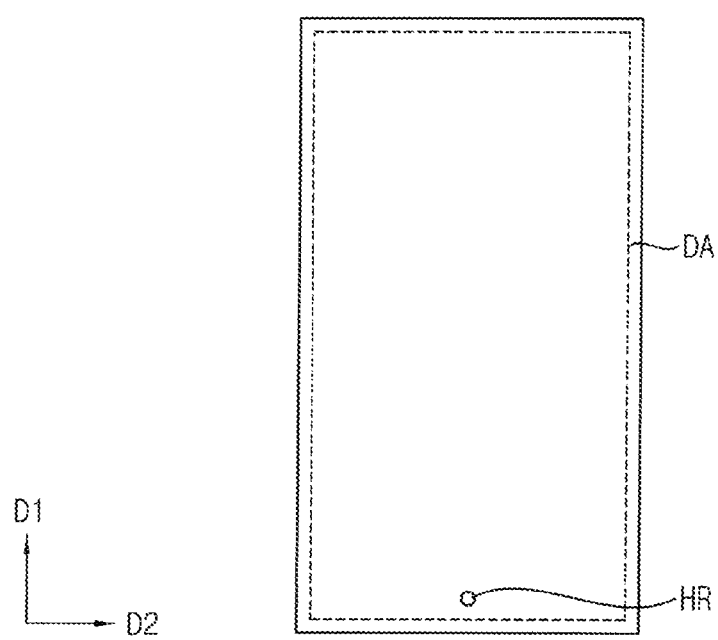
FIG. 10 is a plan view of an exemplary embodiment of a display panel used in a method for manufacturing a display device according to principles of the invention.

FIG. 10 is a plan view of an exemplary embodiment of a display panel used in a method for manufacturing a display device according to principles of the invention. Referring to FIG. 10, a display panel 100 includes a display area DA including a pixel array. In an exemplary embodiment, the display panel 100 may be an organic light-emitting display panel. The peripheral area adjacent to the display area DA may be defined as a non-display area.

In an exemplary embodiment, the display panel 100 may include a hole area HR. The hole area HR may be formed by removing a portion of the display panel 100. After the display panel 100 is attached to a protective window, a functional module may be disposed under or in the hole area HR. The functional module may include at least one of a camera module and a sensor module. In an exemplary embodiment, the hole area HR may be disposed within the display area DA in a plan view.

Figure 11:
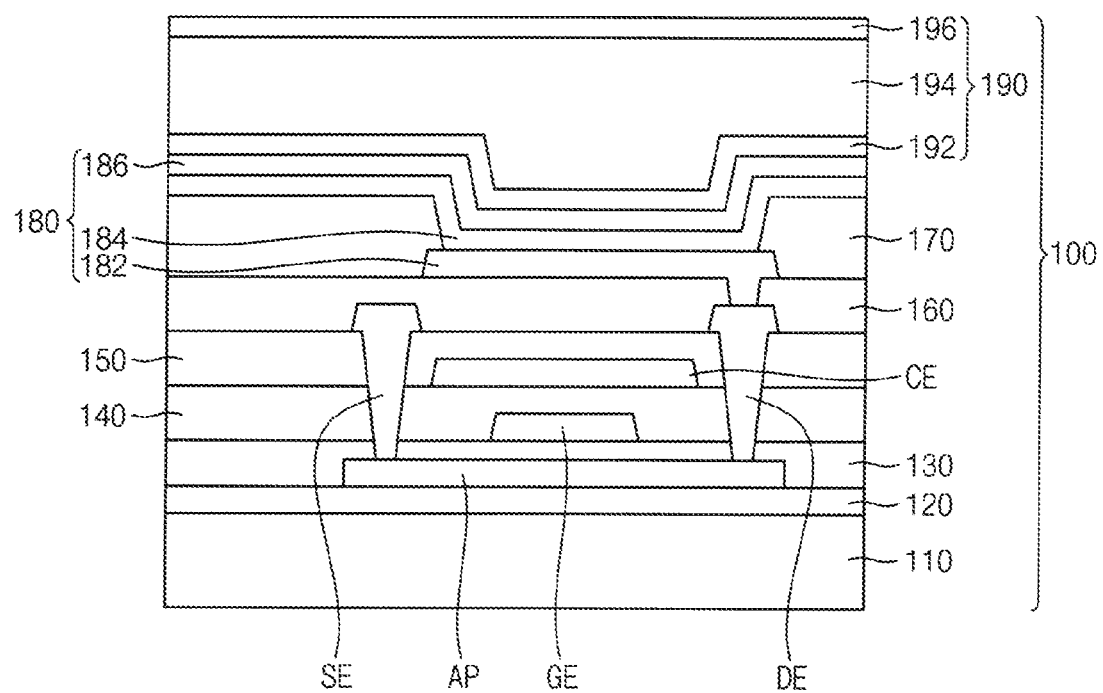
FIG. 11 is a cross-sectional view illustrating a display area of the display panel of FIG. 10.

FIG. 11 is a cross-sectional view illustrating a display area of the display panel of FIG. 10. Referring to FIG. 11, a pixel unit disposed in the display area DA may include a driving element disposed on a base substrate 110 and a light-emitting element electrically connected to the driving element. In an exemplary embodiment, the light-emitting element may be an organic light-emitting diode. The driving element may include at least one thin film transistor. A buffer layer 120 may be disposed on the base substrate 110. An active pattern AP may be disposed on the buffer layer 120.

For example, the base substrate 110 may include a glass, a quartz, a sapphire, a polymeric material or the like. In an exemplary embodiment, the base substrate 110 may be a flexible substrate including a polymeric material. For example, the base substrate 110 may include a polyethylenenaphthelate, a polyethyleneterephehalate, a polyetherketone, a polycarbonate, a polyarylate, a polyethersulphone, a polyimide or a combination thereof.

The buffer layer 120 may prevent or reduce permeation of impurities, humidity or external gas from underneath of the base substrate 110, and may reduce a roughness of an upper surface of the base substrate 110. For example, the buffer layer 120 may include an inorganic material such as an oxide, a nitride or the like.

A first gate metal pattern including a gate electrode GE may be disposed on the active pattern AP. A first insulation layer 130 may be disposed between the active pattern AP and the gate electrode GE.

A second gate metal pattern including a capacitor electrode pattern CE may be disposed on the gate electrode GE. The capacitor electrode pattern CE may include a capacitor electrode for forming a capacitor, a wiring for transferring various signals or the like.

A second insulation layer 140 may be disposed between the gate electrode GE and the capacitor electrode pattern CE. A third insulation layer 150 may be disposed on the capacitor electrode pattern CE.

For example, the active pattern AP may include a silicon or a metal oxide semiconductor. In an embodiment, the active pattern AP may include a polycrystalline silicon (polysilicon), which may be doped with n-type impurities or p-type impurities.

In another exemplary embodiment or in another transistor that is not illustrated, an active pattern may include a metal oxide semiconductor. For example, the active pattern may include a two-component compound ($AB_x$), a ternary compound ($AB_xC_y$) or a four-component compound ($AB_xC_yD_z$), which contains indium (In), zinc (Zn), gallium (Ga), tin (Sn), titanium (Ti), aluminum (Al), hafnium (Hf), zirconium (Zr), magnesium (Mg). For example, the active pattern may include a zinc oxide ($ZnO_x$), a gallium oxide ($GaO_x$), a titanium oxide ($TiO_x$), a tin oxide ($SnO_x$), an indium oxide ($InO_x$), an indium-gallium oxide (IGO), an indium-zinc oxide (IZO), an indium tin oxide (ITO), a gallium zinc oxide (GZO), a zinc magnesium oxide (ZMO), a zinc tin oxide (ZTO), a zinc zirconium oxide ($ZnZr_xO_y$), an indium-gallium-zinc oxide (IGZO), an indium-zinc-tin oxide (IZTO), an indium-gallium-hafnium oxide (IGHO), a tin-aluminum-zinc oxide (TAZO), an indium-gallium-tin oxide (IGTO) or the like.

The first insulation layer 130, the second insulation layer 140 and the third insulation layer 150 may include a silicon oxide, a silicon nitride, a silicon carbide or a combination thereof. Furthermore, the first insulation layer 130, the second insulation layer 140 and the third insulation layer 150 may include an insulating metal oxide such as an aluminum oxide, a tantalum oxide, a hafnium oxide, a zirconium oxide, a titanium oxide or the like. For example, the first insulation layer 130, the second insulation layer 140 and the third insulation layer 150 may have a single-layered structure or a multi-layered structure including a silicon nitride and/or a silicon oxide, respectively, or may have different structures from each other.

The gate electrode GE and the capacitor electrode pattern CE may include a metal, a metal alloy, a metal nitride, a conductive metal oxide or the like. For example, the gate electrode GE and the capacitor electrode pattern CE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 150. The first source metal pattern may include a source electrode SE and a drain electrode DE, which electrically contact the active pattern AP. The source electrode SE and the drain electrode DE may pass through the insulation layers disposed thereunder to contact the active pattern AP, respectively.

The first source metal pattern may include a metal, a metal alloy, a metal nitride, a conductive metal oxide or the like. For example, the first source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an exemplary embodiment, the first source metal pattern may have a multi-layered structure including an aluminum layer.

A fourth insulation layer 160 may be disposed on the first source metal pattern. The fourth insulation layer 160 may include an organic material. For example, the fourth insulation layer 160 may include an organic insulation material such as a phenol resin, an acryl resin, a polyimide resin, a polyamide resin, a siloxane resin, an epoxy resin or the like.

An organic light-emitting diode 180 may be disposed on the fourth insulation layer 160. The organic light-emitting diode 180 may include a first electrode 182 electrically contacting the drain electrode DE, an organic light-emitting layer 184 disposed on the first electrode 182 and a second electrode 186 disposed on the organic light-emitting layer 184. The organic light-emitting layer 184 of the organic light-emitting diode 180 may be disposed at least in an opening of a pixel-defining layer 170 disposed on the fourth insulation layer 160. The first electrode 182 may be a lower electrode of the organic light-emitting diode 180, and the second electrode 186 may be an upper electrode of the organic light-emitting diode 180.

The first electrode 182 may function as an anode. For example, the first electrode 182 may be formed as a transmitting electrode or a reflecting electrode according to an emission type of the display device. When the first electrode 182 is a transmitting electrode, the first electrode 182 may include an indium tin oxide, an indium zinc oxide, a zinc tin oxide, an indium oxide, a zinc oxide, a tin oxide or the like.

When the first electrode 182 is a reflecting electrode, the first electrode 182 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

The pixel-defining layer 170 has the opening overlapping at least a portion of the first electrode 182. For example, the pixel-defining layer 170 may include an organic insulating material. The organic light-emitting layer 184 may include at least a light-emitting layer, and may further include at least one of a hole injection layer (HIL), a hole transporting layer (HTL), an electron transporting layer (ETL) and an electron injection layer (EIL). For example, the organic light-emitting layer 184 may include a low molecular weight organic compound or a high molecular weight organic compound.

In an exemplary embodiment, the organic light-emitting layer 184 may emit a red light, a green light or a blue light. In another exemplary embodiment, the organic light-emitting layer 184 may emit a white light. The organic light-emitting layer 184 emitting a white light may have a multi-layer structure including a red-emitting layer, a green-emitting layer and a blue-emitting layer, or a single-layer structure including a mixture of a red-emitting material, a green-emitting material and a blue-emitting material.

The second electrode 186 may be formed as a transmitting electrode or a reflecting electrode according to an emission type of the display device. For example, the second electrode 186 may include a metal, a metal alloy, a metal nitride, a metal fluoride, a conductive metal oxide or a combination thereof. For example, the second electrode 186 and at least one layer of the organic light-emitting layer 184 may be formed as a common layer extending continuously over a plurality of pixels in a display area.

An encapsulation layer 190 may be disposed on the organic light-emitting diode 180. The encapsulation layer 190 may have a stacked structure of an inorganic thin film and an organic thin film. For example, the encapsulation layer 190 may include a first inorganic thin film 192, an organic thin film 194 disposed on the first inorganic thin film 192 and a second inorganic thin film 196 disposed on the organic thin film 194. As desired, at least one of a touch-sensing structure and a polarizing layer may be disposed on the encapsulation layer 190. A supporting substrate may be disposed under the base substrate 110. The supporting substrate may have an opening to reduce a bending stress in a bending area.

Figure 13:
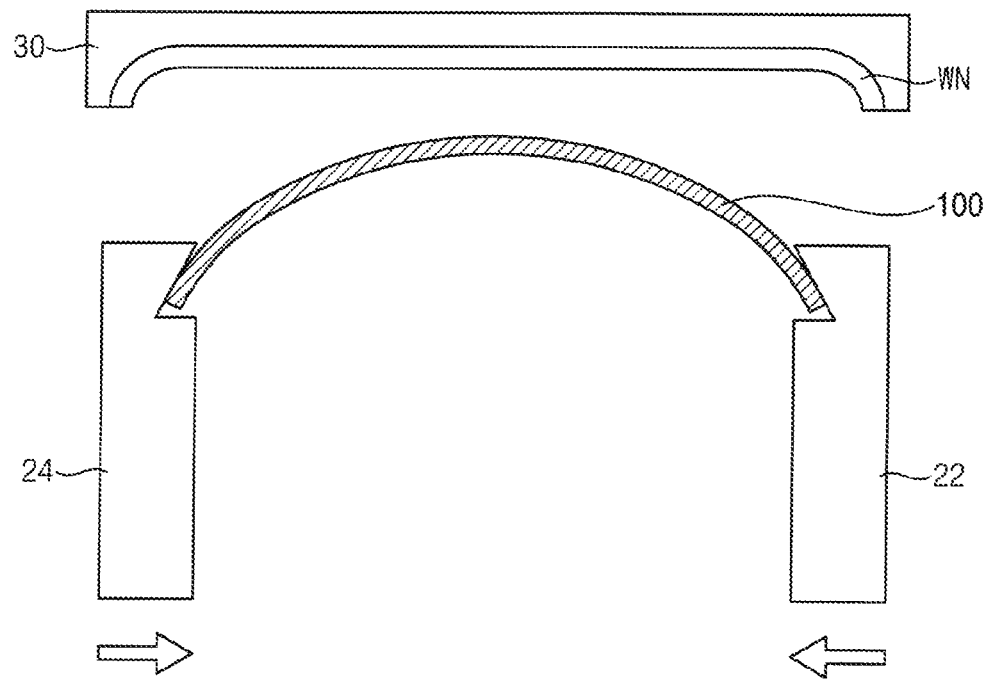
Figure 14:
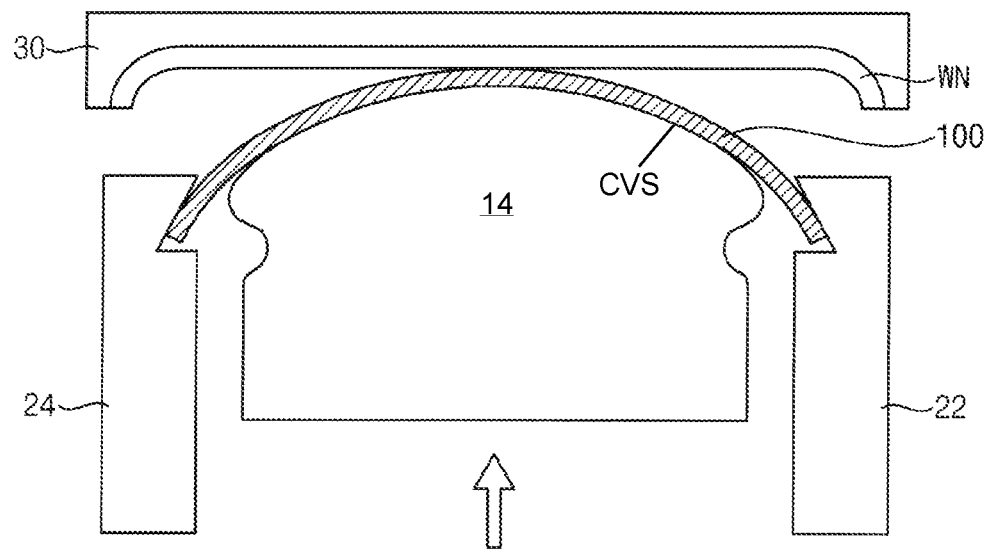
Figure 15:
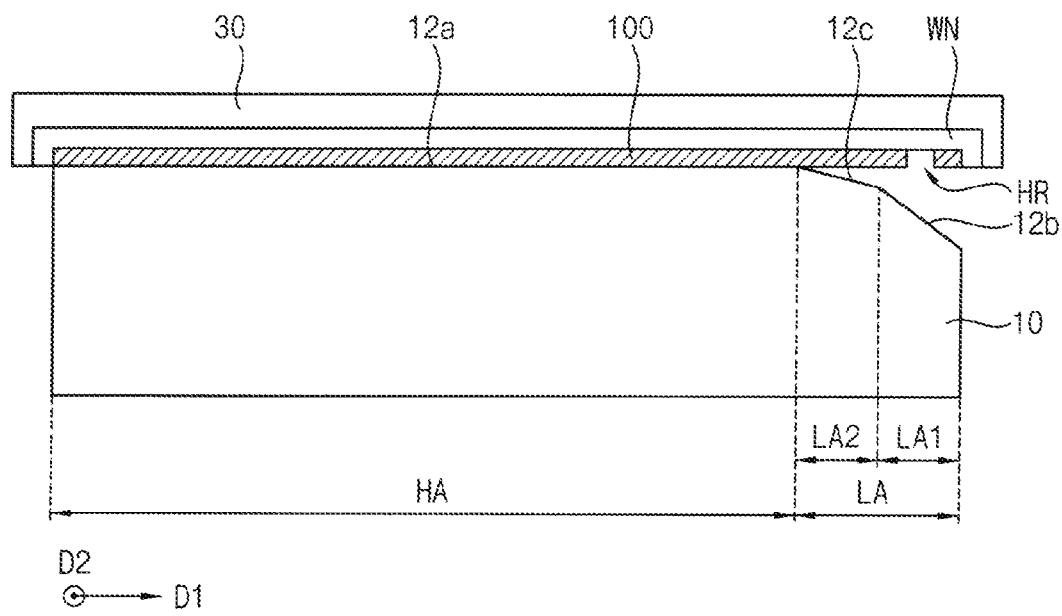
Figure 16:
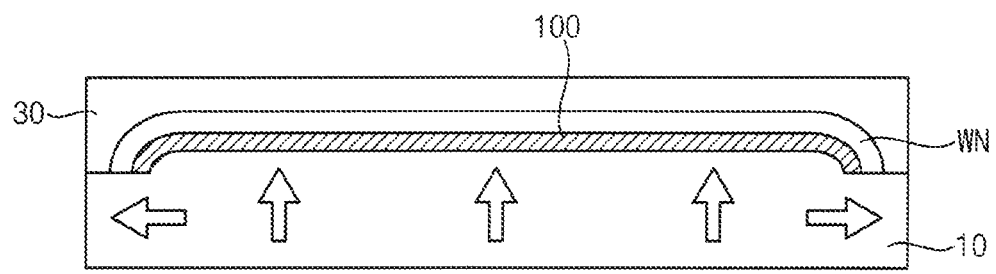
Figure 17:
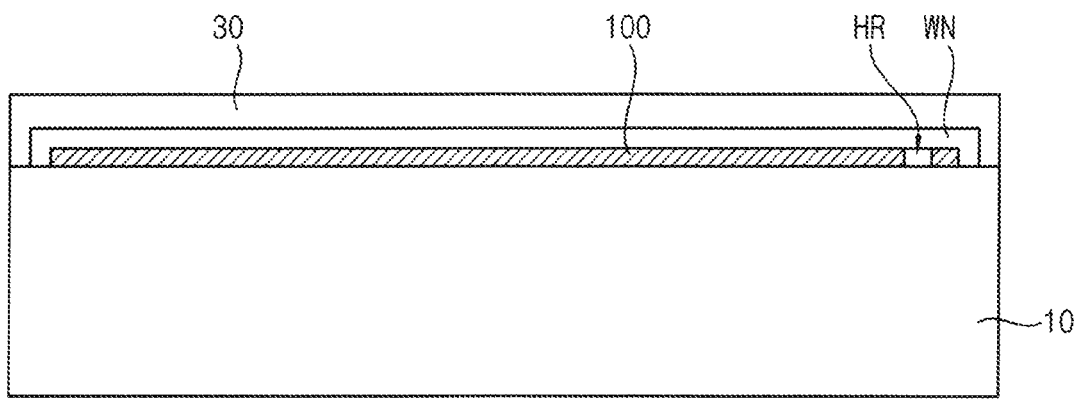

FIGS. 12 to 17 are cross-sectional views illustrating an exemplary method for manufacturing a display device according to principles of the invention. FIGS. 12 to 14 and 16 illustrate a cross-section along a shorter side direction, and FIGS. 15 and 17 illustrate a cross-section along a longer side direction.

Figure 12:
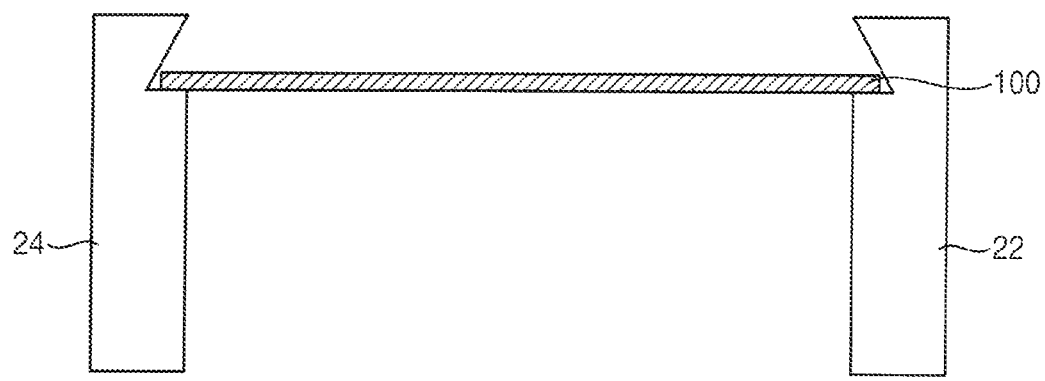
FIGS. 12 to 17 are cross-sectional views illustrating an exemplary method for manufacturing a display device according to principles of the invention.

Referring to FIG. 12, a display panel 100 is fixed by a clamp. The display panel 100 may include a hole area as illustrated in FIG. 10. However, the exemplary embodiments are not limited thereto. The display panel 100 may include an opening or a cut portion, which has various shapes such as a generally elongated shape, a generally slit shape, a generally curved shape, a generally polygonal shape or the like. In some exemplary embodiments, the opening or cut portion can form a hole HR, as discussed below with respect to FIG. 17.

The clamp may fix both ends of the display panel 100. For example, a first clamp 22 may fix a first end of the display panel 100, and a second clamp 24 may fix a second end of the display panel 100. The first and second ends may extend along a first direction D1, and the first and second clamps 22 and 24 may be spaced apart from each other along a second direction D2 substantially perpendicular to the first direction D1.

Referring to FIG. 13, a protective window WN is disposed on the display panel 100. The protective window WN may be rigid or flexible. For example, the protective window WN may include a glass substrate, a polymeric film or a combination thereof. The protective window WN may be fixed to a fixing member 30. The fixing member 30 may cover an upper surface of the protective window WN, and may secure the protective window WN, for example by applying a negative pressure to the protective window WN.

In an exemplary embodiment, the protective window WN may have a bent edge. However, the exemplary embodiments are not limited thereto. For example, flexible pads of some exemplary embodiments may be used for attaching a protective window having a generally flat plate shape with a display panel.

An adhesive layer may be disposed on a lower surface of the protective window WN or on an upper surface of the display panel 100. Contact between the display panel 100 and the protective window WN may preferably start from a center portion and may expand to a peripheral portion to prevent air from being trapped between the display panel 100 and the protective window WN. For example, the display panel 100 may be bent so that a center portion may protrude upwardly. For example, the distance between the first clamp 22 and the second clamp 24 may be reduced to bend the display panel 100.

Referring to FIG. 14, the flexible pad 10 is disposed under the display panel 100 and moved toward the protective window WN so that the display panel 100 may contact the protective window WN. The flexible pad 10 may have substantially the same shape as any of the flexible pads described herein 6. Thus, repetitive explanation for the flexible pad 10 may be omitted to avoid redundancy.

Referring to FIG. 14, the flexible pad 10 may include a generally straight area HA and an inclined area LA. An upper surface of the generally straight area HA may have substantially the same height along a first direction D1, and an upper surface of the inclined area LA may be inclined along the first direction D1. The inclined area LA may include a first inclined area LA1 and a second inclined area LA2. The second inclined area LA2 may be disposed between the first inclined area LA1 and the generally straight area HA. Except for the boundary where the two inclined areas meet, the height (thickness) of an upper surface 12b of the first inclined area LA1 may be smaller than the height (thickness) of an upper surface 12c of the second inclined area LA2.

Referring to FIGS. 14 and 15, since the upper surface of the generally straight area HA of the flexible pad 10 has a height greater than the upper surface of the inclined area LA, the generally straight area HA may contact the display panel before than the inclined area LA.

In an exemplary embodiment, the flexible pad 10 may linearly contact the display panel 100 along the line intersecting a center portion of the generally straight area HA along the first direction D1. The contact area may expand from the linear contact area along the second direction D2. If the flexible pad 10 contacts the display panel 100 at the center point and if the contact area expands from the point contact area, the display panel 100 may be gradually adhered to the protective window WN at all sides thereby increasing the internal stress of the display panel 100. Thus, durability of the display panel 100 may be deteriorated.

In an exemplary embodiment, the hole area HR of the display panel 100 may overlap the first inclined area LA1, which has the smallest height (thickness) in the flexible pad 10. Thus, the hole area HR may be pressed later than other areas, and may be pressed by a lesser load than the area overlapping the generally straight area HA.

The upper surface 12*c* of the second inclined area LA2 may have an inclination angle smaller than an inclination angle of the upper surface 12*b* of the first inclined area LA1. Thus, the second inclined area LA2 may prevent a sharp change in height between the generally straight area HA and the first inclined area LA1 so that stress concentration of the display panel 100 on the boundary area may be reduced or prevented. The upper surface 12*b* of the first inclined area LA1 may be inclined along the first direction D1 and may be generally flat along the second direction D2.

If the upper surface of the flexible pad 10 that overlaps the hole area HR is generally flat along the first direction D1, even though the height of the upper surface overlapping the hole area HR is lowered to reduce a pressing load, a silicone resin may move to the lowered area from an adjacent area thereto. Thus, the pressing load applied to the hole area HR and a tensile force therefrom may be substantially increased. Furthermore, if the upper surface overlapping the hole area HR is not flat along the second direction D2, the tensile force applied to the hole area HR along the second direction D2 may be increased.

Thus, it may be preferred that the upper surface of the flexible pad 10 overlapping the hole area HR is inclined along the first direction D1 and flat along the second direction D2, in order to reduce the pressing load and a tensile force applied to the hole area HR. In some exemplary embodiments, the size, the shape and the position of the first inclined area LA1 may be changed depending on configuration of the hole area HR.

Referring to FIGS. 16 and 17, the flexible pad 10 is pressed toward the display panel 100 and the protective window WN. Since the flexible pad 10 is flexible, the flexible pad 10 may be deformed so that an entire upper surface of the display panel 100 may contact a lower surface of the protective window WN.

As a result, the protective window WN may be attached to the display panel 100. The display panel 100 attached to the protective window WN may have a bent edge corresponding to a bending edge of the protective window WN.

According to some exemplary embodiments, a flexible pad is used for attaching a display panel with a protective window. Thus, damage to the display panel and trapped air may be reduced or prevented.

Furthermore, the flexible pad includes an inclined area that may reduce or disperse the pressing load and/or a tensile force, which is applied to a physically weak area, such as a hole, of the display panel.

Some exemplary embodiments may be applied to various processes that may use a flexible pressing member. For example, some exemplary embodiments may be used in a lamination process. For example, the exemplary embodiments may be used for manufacturing display devices.

What is claimed is:

1. A flexible pad for a display device lamination process, the flexible pad comprising:
    a generally straight area having an upper surface defining substantially the same height along a first direction and a generally convex shape along a second direction generally perpendicular to the first direction;
    a first inclined area having a first upper surface inclined along the first direction at a first inclination angle and being generally flat along the second direction; and
    a second inclined area disposed between the first inclined area and the generally straight area, wherein the second inclined area has a second upper surface inclined along the first direction at a second inclination angle smaller than the first inclination angle.

2. The flexible pad of claim 1, wherein the first inclined area has a first thickness, and the second inclined area has a second thickness greater than the first thickness.

3. The flexible pad of claim 1, wherein the flexible pad comprises a silicone resin.

4. The flexible pad of claim 1, wherein the second upper surface has a generally round shape along the first direction.

5. The flexible pad of claim 1, wherein the second inclined area at least partially surrounds the first inclined area in a plan view.

6. The flexible pad of claim 1, wherein the second upper surface of the second inclined area is inclined along the second direction.

7. The flexible pad of claim 1, wherein the first upper surface is connected to a first side surface, and the upper surface of the generally straight area is connected to a second side surface opposite to the first side surface.

8. The flexible pad of claim 7, wherein the second upper surface of the second inclined area is connected to a third side surface and a fourth side surface, which connect the first side surface to the second side surface with the third and fourth surface being opposite to each other.

9. A method for manufacturing a display device, the method comprising the steps of:
    disposing a protective window on a display panel including an opening or a cut portion;
    disposing a flexible pad under the display panel; and
    moving the flexible pad toward the protective window so that the display panel contacts the protective window,
    wherein the flexible pad includes a generally straight area, a first inclined area overlapping the opening or the cut portion of the display panel and a second inclined area disposed between the generally straight area and the first inclined area, an upper surface of the generally straight area having substantially the same thickness along a first direction and having a generally convex shape along a second direction substantially perpendicular to the first direction, an upper surface of the first inclined area inclined along the first direction and generally flat along the second direction, an upper surface of the second inclined area inclined along the first direction by an inclination angle smaller than an inclination angle of the upper surface of the first inclined area.

10. The method of claim 9, wherein the display panel includes an organic light-emitting display panel.

11. The method of claim 9, wherein the display panel includes a flexible base substrate comprising a polymeric material.

12. The method of claim 9, wherein the opening or the cut portion of the display panel forms a hole.

13. The method of claim 9, further comprising the step of bending the display panel before the display panel contacts the protective window.

14. The method of claim 9, wherein the step of bending the display panel includes moving clamps attached to both ends of the display panel so that a distance between the clamps is reduced.

15. The method of claim 9, wherein the flexible pad comprises a silicone resin.

16. The method of claim 9, wherein the upper surface of the second inclined area has a generally round shape along the first direction.

17. The method of claim 9, wherein the upper surface of the second inclined area is inclined along the second direction.

18. The method of claim 9, wherein a first upper surface of the first inclined area is connected to a first side surface, and the upper surface of the generally straight area is connected to a second side surface opposite to the first side surface, wherein a second upper surface of the second inclined area is connected to a third side surface and a fourth side surface, which couple the first side surface to the second side surface and are opposite to each other.

19. A flexible pad for a display panel lamination process, the flexible pad comprising:
  a generally straight area with an upper surface having substantially the same height along a first direction and a generally convex shape along a second direction substantially perpendicular to the first direction;
  a first inclined area with an upper surface being inclined along the first direction and generally flat along the second direction and connected to a first end of the upper surface of the generally straight area; and
  a second inclined area with an upper surface being inclined along the first direction and generally flat along the second direction and connected to a second end of the upper surface of the generally straight area to the first end.

20. The flexible pad of claim 19, wherein an upper surface of the first inclined area is connected to a first side surface, an upper surface of the second inclined area is connected to a second side surface opposite to the first side surface, wherein the upper surface of the generally straight area is connected to the first and second side surfaces so the generally straight area at least partially surrounds the first and second inclined areas, respectively, in a plan view.

\* \* \* \* \*